United States Patent
Mullins et al.

(10) Patent No.: US 8,565,709 B2
(45) Date of Patent: Oct. 22, 2013

(54) DIGITAL SIGNAL FILTER

(75) Inventors: Scott P. Mullins, San Jose, CA (US); Timothy M. Johnson, San Jose, CA (US); Yehonatan Perez, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 313 days.

(21) Appl. No.: 13/023,902

(22) Filed: Feb. 9, 2011

(65) Prior Publication Data

US 2012/0169433 A1  Jul. 5, 2012

Related U.S. Application Data

(60) Provisional application No. 61/428,667, filed on Dec. 30, 2010.

(51) Int. Cl.
*H04B 1/10* (2006.01)

(52) U.S. Cl.
USPC .......................................... 455/307; 455/310

(58) Field of Classification Search
USPC ........ 455/556.1, 307, 296, 310; 333/165, 167
See application file for complete search history.

(56) References Cited

U.S. PATENT DOCUMENTS

| | | | |
|---|---|---|---|
| 7,181,239 B2 | 2/2007 | Yamamoto et al. | |
| 7,646,254 B2 | 1/2010 | Kantor et al. | |
| 7,808,342 B2 * | 10/2010 | Prikhodko et al. | 333/103 |
| 7,818,030 B2 | 10/2010 | Kawamoto | |
| 2007/0152765 A1 | 7/2007 | Chen | |
| 2008/0055017 A1 * | 3/2008 | Shafer | 333/132 |
| 2011/0133853 A1 * | 6/2011 | Harima et al. | 333/175 |
| 2012/0081193 A1 * | 4/2012 | Shirakawa et al. | 333/176 |

FOREIGN PATENT DOCUMENTS

KR  20090032228  4/2009

OTHER PUBLICATIONS

"TA 0318 Technical Article", *EMI and ESD consideration for LCD and Cameras in wireless handsets;* STMicroelectronics, http://www.st.com/stonline/products/literature/ta/11348.pdf, (2005), pp. 1-6.

Wang, Hongxia, et al., "Electromagnetic Interference and Digitial Curcuits: An Initial Study of Clock Networks", Electromagnetics 26.1 (2006): 73-86, (pp. 1-15).

Wang, Hongxia, et al., "Radio Frequency Effects on the Clock Networks of Digital Cicuits", Proc. IEEE International Symposium on Electromagnetic Compatibility (EMC 2004), pp. 93-96, Santa Clara, CA, Aug. 2004, (4 pages).

* cited by examiner

*Primary Examiner* — Nguyen Vo

(74) *Attorney, Agent, or Firm* — Blakely, Sokoloff, Taylor & Zafman LLP

(57) ABSTRACT

A passive filter circuit filters an input signal to attenuate an undesired frequency. The passive filter circuit includes a first stage and a second stage. The input to the first stage is the input signal. The first stage includes a first inductor and a first branch coupled to the output of the first inductor. The first branch includes a first capacitor and a second inductor. The first stage is coupled to the second stage. The second stage includes a third inductor and a second branch coupled to the output of the third inductor. The second branch includes a second capacitor. Other embodiments are also described and claimed.

22 Claims, 6 Drawing Sheets

DIGITAL SIGNAL FILTER

CROSS-REFERENCE TO RELATED APPLICATION

This present U.S. Non-Provisional Patent Application claims the benefit of the earlier filing date of related U.S. Provisional Application No. 61/428,667, filed Dec. 30, 2010, currently pending.

FIELD OF THE INVENTION

An embodiment of the invention relates to a filter circuit for attenuating an undesired frequency in a digital signal. Other embodiments are also described.

BACKGROUND

In recent years, portable consumer electronic wireless communications devices such as smart phones, tablet computers, and laptop computers have been equipped with a variety of integrated digital subsystems. One example of such a subsystem is an integrated digital camera. The cameras used in such devices are often in the form of a module that includes, for example, a charge coupled device (CCD) imaging sensor or a complementary metal oxide semiconductor (CMOS) imaging sensor that is in a compact package together with its optical system. Camera modules having either type of imaging sensor move photodetected charge as a mass of digital signals sequentially, at a rate synchronized with a clock signal that is typically generated from a source outside the camera module. The clock signal that is input to the camera module and the digital data signal that is output in synchronism with the clock signal contain harmonic components that may interfere with the operation of other integrated subsystems such as the radio communications circuitry. In the case where a harmonic component coincides with the radio communication frequency band, the radio communication would be adversely affected.

With the recent trend toward wireless communications devices of increasingly smaller size, the radio communications circuitry, the camera module, and the camera clock signal generator are often arranged within the housing or body of the device in close proximity to each other. For instance, in order to have a thinner body, the camera module is not mounted directly on a main logic board, but rather may be connected to the main logic board and the clock signal generator through a flexible circuit. In this case, the radiation noise of the harmonic components of the clock signal and the digital data signal may be released from the flexible circuit and interfere with radio communications. On the other hand, radio communications frequencies may be picked up by the flexible circuit and interfere with the camera clock signal and the digital data signal that is transmitted to and from the camera module through the flexible circuit.

SUMMARY

In accordance with an embodiment of the invention, a passive filter circuit may be used to attenuate an undesired frequency component in a digital signal. The passive filter circuit includes a first stage that is to receive the digital signal and a second stage that is coupled to the output of the first stage. The first stage includes a first inductor and a first branch that is coupled to the output of the first inductor. The first branch includes a first capacitor and a second inductor. The second stage includes a third inductor and a second branch that is coupled to the output of the third inductor. The second branch includes a second capacitor. The passive filter circuit may be used within a wireless communications device having a camera module that uses a clock signal, to attenuate a harmonic component in the clock signal that coincides with a radio communications frequency, without significantly degrading the rise time of the clock signal. Other digital signal applications are possible.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Embodiments of the invention will now be described with reference to the drawings summarized below. The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
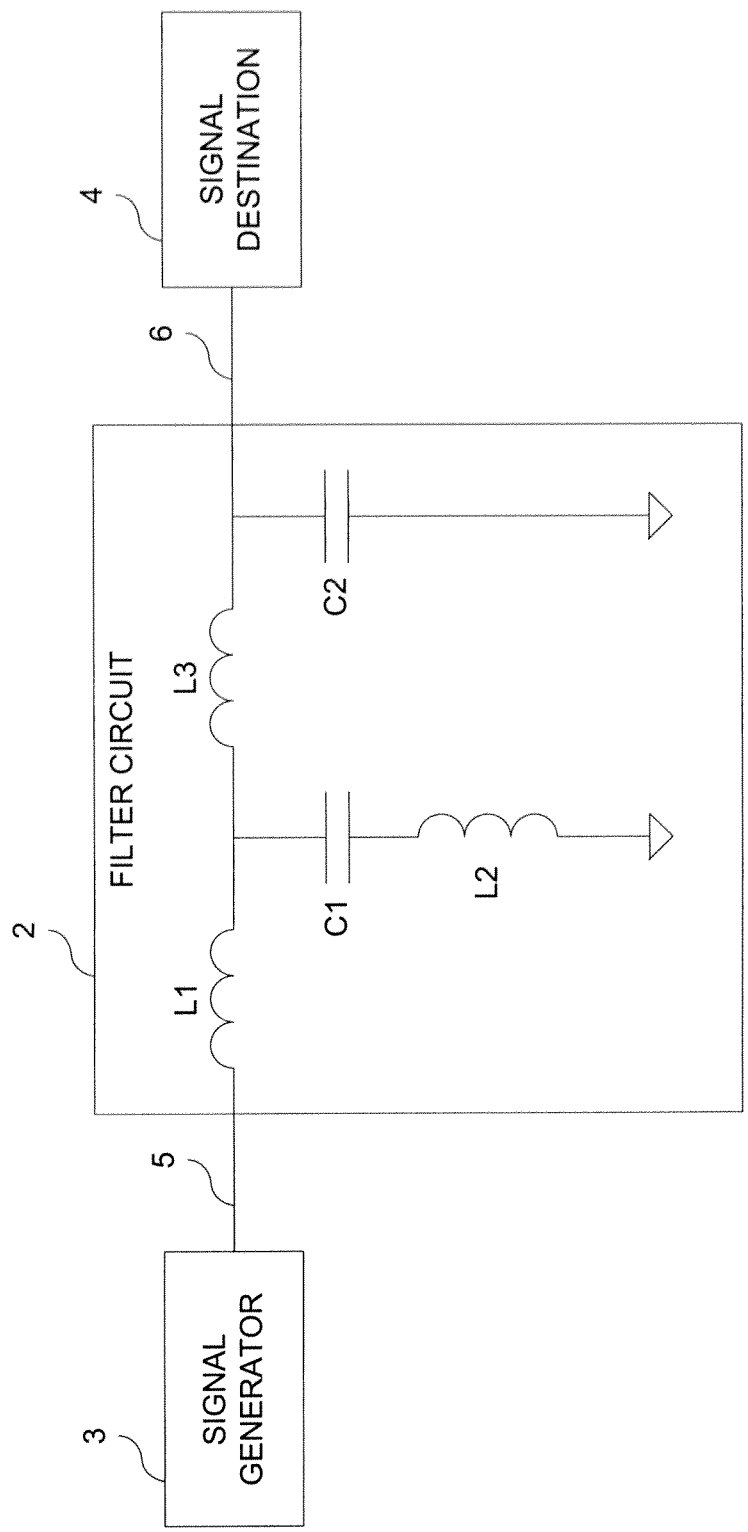
FIG. 1 is a circuit schematic of a passive filter circuit according to an embodiment of the invention

FIG. 1 shows a circuit schematic of a filter circuit 2 that may be used to attenuate an undesired frequency component that may be present in an input signal 5. This is achieved by inserting the filter circuit 2 in line with the input signal 5. The input signal 5 may be any digital signal such as a clock signal, a data signal, a control signal, etc. For instance, the filter circuit 2 may receive the input signal 5 from a signal generator 3 and provide a filtered signal 6 to a signal destination 4.

The filter circuit 2 is formed using a combination of capacitors and inductors, both of which are passive components (i.e., components that do not depend on an external power supply). Because the filter circuit 2 is formed using passive components, the filter circuit 2 is unlikely to be impacted by radiated interference from other nearby subsystems. The filter circuit 2 includes inductors L1, L2, and L3, and capacitors C1 and C2.

The filter circuit 2 may be described as having a first stage and a second stage. An input of the first stage of the filter circuit 2 receives the input signal 5 from the signal generator 3. The first stage is an LC stage that includes the inductor L1 and a first branch (also referred to as a first leg) that is coupled to the output of the inductor L1 (i.e., connected to a node between the series inductors L1 and L3). The first branch includes the capacitor C1 and the inductor L2 which is added in series to the capacitor C1 and connected to ground. The added inductor L2 to the first branch reduces the resonant frequency of the first branch (which is attenuated), without having to increase the value of the capacitor C1, which would significantly degrade the rise time of the filtered signal 6 (and lead to a larger component and hence an undesired result especially when implemented with a handheld mobile communications device such as a smartphone). The rise time of the filtered signal 6 is sufficiently maintained when its rise time is sufficiently fast (i.e., short) as dictated by the requirements of the signal destination 4. In one embodiment, the rise time of the filtered signal 6 may be considered sufficiently fast when the time interval of the rise time does not exceed 12 ns at a voltage swing of 1.8 V. In such an embodiment, a frequency component may be deemed attenuated by the filter circuit 2 if it is reduced by at least 20 dB.

The first stage of the filter circuit 2 is connected to a second stage. The second stage is also an LC stage that includes the inductor L3 and a second branch (also referred to as a second leg) that is coupled to the output of the inductor L3 (i.e., the output of the filter circuit 2). The second branch includes the capacitor C2 which is connected to ground. The second stage provides a rolled-off frequency response at or above the undesired frequency component. An output of the second stage (i.e., the output of the filter circuit 2) is connected to the signal destination 4 to provide the filtered signal 6 to the signal destination 4.

The inductor L3 and the capacitors C1 and C2 form an LC pi filter (also referred to as a capacitor-input filter). The inductor L3 forms the series component of the LC pi filter and the capacitors C1 and C2 form the parallel or shunt components of the LC pi filter. The inductor L1 is coupled to the input of the LC pi filter. The inductor L2 is added to the first leg of the LC pi filter in series with the capacitor C1. The first and second legs of the LC pi filter are connected to ground (which may not be at zero volts but rather at any power supply return node voltage).

The filter circuit 2 may be configured to attenuate an undesired frequency by selecting inductance and capacitance values for the first stage such that the resonant frequency of the first stage equals (i.e., is within a practical tolerance range of) the undesired frequency. When the resonant frequency of the first stage equals the undesired frequency, the filter circuit 2 attenuates the undesired frequency in the input signal 5. The amount of attenuation depends on the values of the dominant contributing components in the filter circuit 2, namely inductors L1 and L2 and capacitor C1. In an embodiment of the invention, the inductor L1 may have a value greater than the inductor L3, and the inductor L3 may have a value greater than the inductor L2. The capacitors C1 and C2 may have substantially the same capacitance value, allowing for practical tolerances (e.g., a nominal capacitance value ±5%) assigned to each discrete component by its manufacturer. For example, the component values for the capacitor C1 and the inductors L1 and L2 may be chosen so that the resonant frequency of the first stage is reduced from 3 GHz to a narrow band, for example, around 880 MHz (or other similar fundamental RF radiated carrier signal frequency) and attenuated by a minimum of 20 dB. The component values for the capacitor C2 and inductor L3 may be chosen to provide a rolled-off frequency response above 880 MHz.

Figure 2:
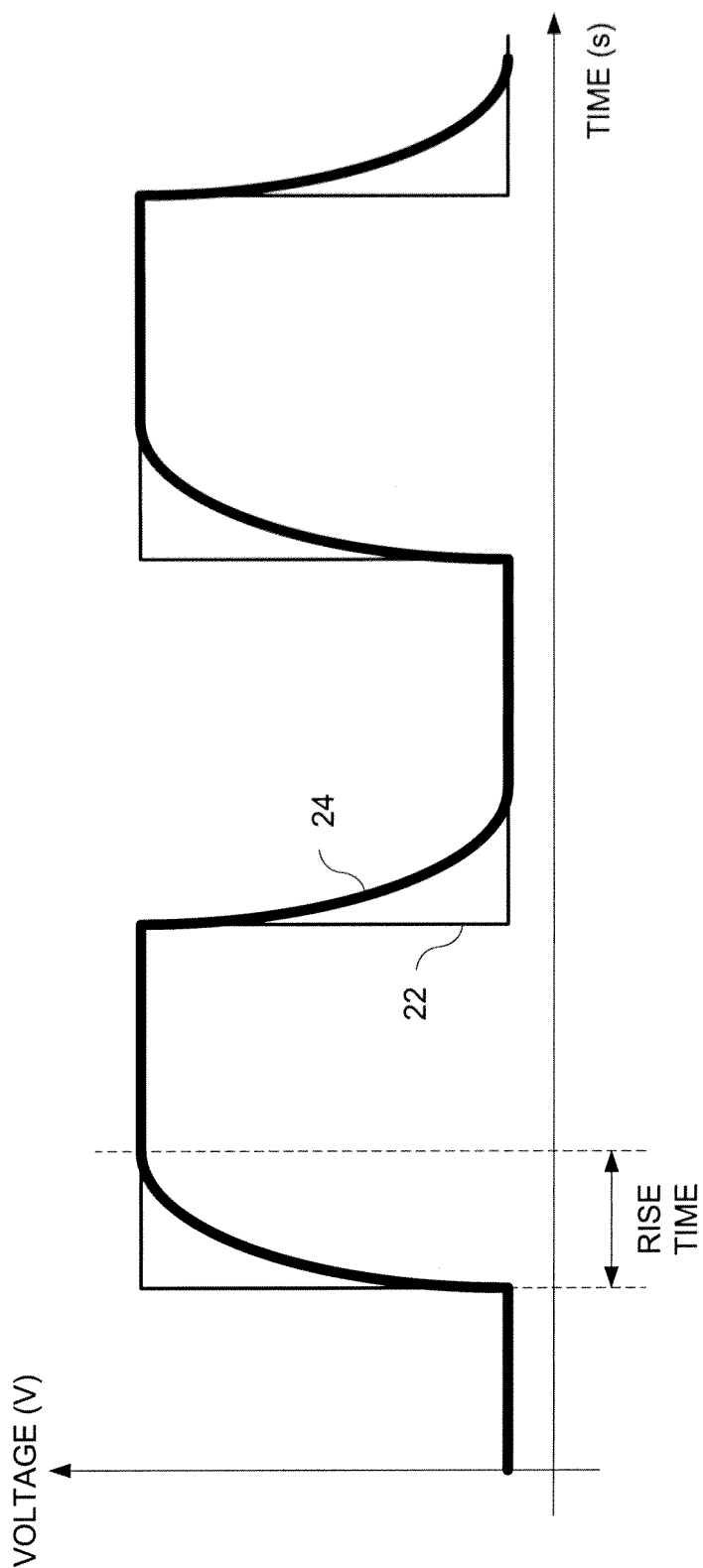
FIG. 2 is a waveform diagram of an example digital signal and a filtered version of the digital signal.

FIG. 2 shows a waveform diagram of an example digital signal 22 that is produced by a signal generator and a filtered version of the digital signal 24 that is provided by a filter circuit of FIG. 1. The term digital signal as used here refers to a signal that has at least two or more discrete and stable levels. The digital signal 22 may be, for example, a clock signal that has a square wave with a 50% duty cycle with a fixed constant fundamental frequency that is, for example, less than 100 MHz. The term "square wave" is used here generically to also refer to rectangular shaped waveforms, i.e. pulse signals whose duty cycle may be different than 50%. The filtered version 24 has an undesired frequency (that may be a harmonic component of the unfiltered version 22) attenuated, without significantly degrading the rise time of the filtered clock signal 24. In one embodiment, proper selection of the inductance value of the inductor L2, in view of L1 and C1, may enable the time interval of the rise time of the filtered clock signal 24 to not exceed 12 ns at a voltage swing of 1.8 V.

Figure 3:
FIG. 3 is an illustration showing a user holding an example communications device during a call.
Figure 4:
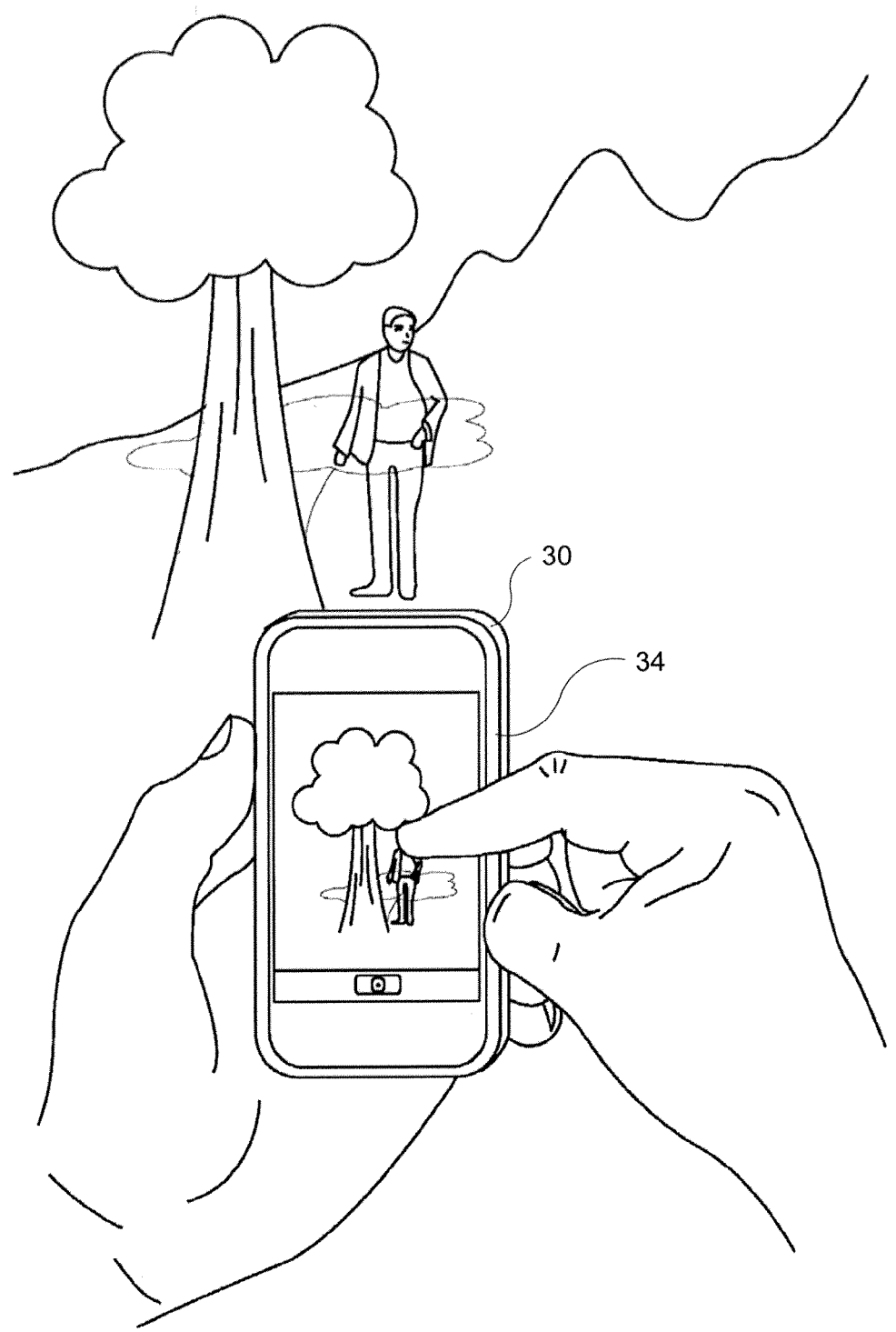
FIG. 4 is an illustration showing a user holding an example communications device while taking a video of a scene.

FIGS. 3-6 show an example of a camera-equipped mobile communications device 30 in which the passive filter circuit may be used. FIG. 3 shows a user holding a handheld version of the multi-function device 30 in his hand against his ear (during a call). FIG. 4 shows a user holding the device 30 up to take a video of a scene. The device 30 may be any camera-equipped portable communications device, such as a cellular phone, a smart phone, a notebook personal computer, or a tablet-like computer, all of which may have a built-in digital camera in addition to wireless communication capabilities (e.g., cellular network connectivity, WLAN connectivity). The device 30 may have an exterior back face in which there is a rear-facing camera 32 and an exterior front face in which there is a display screen 34.

Figure 5:
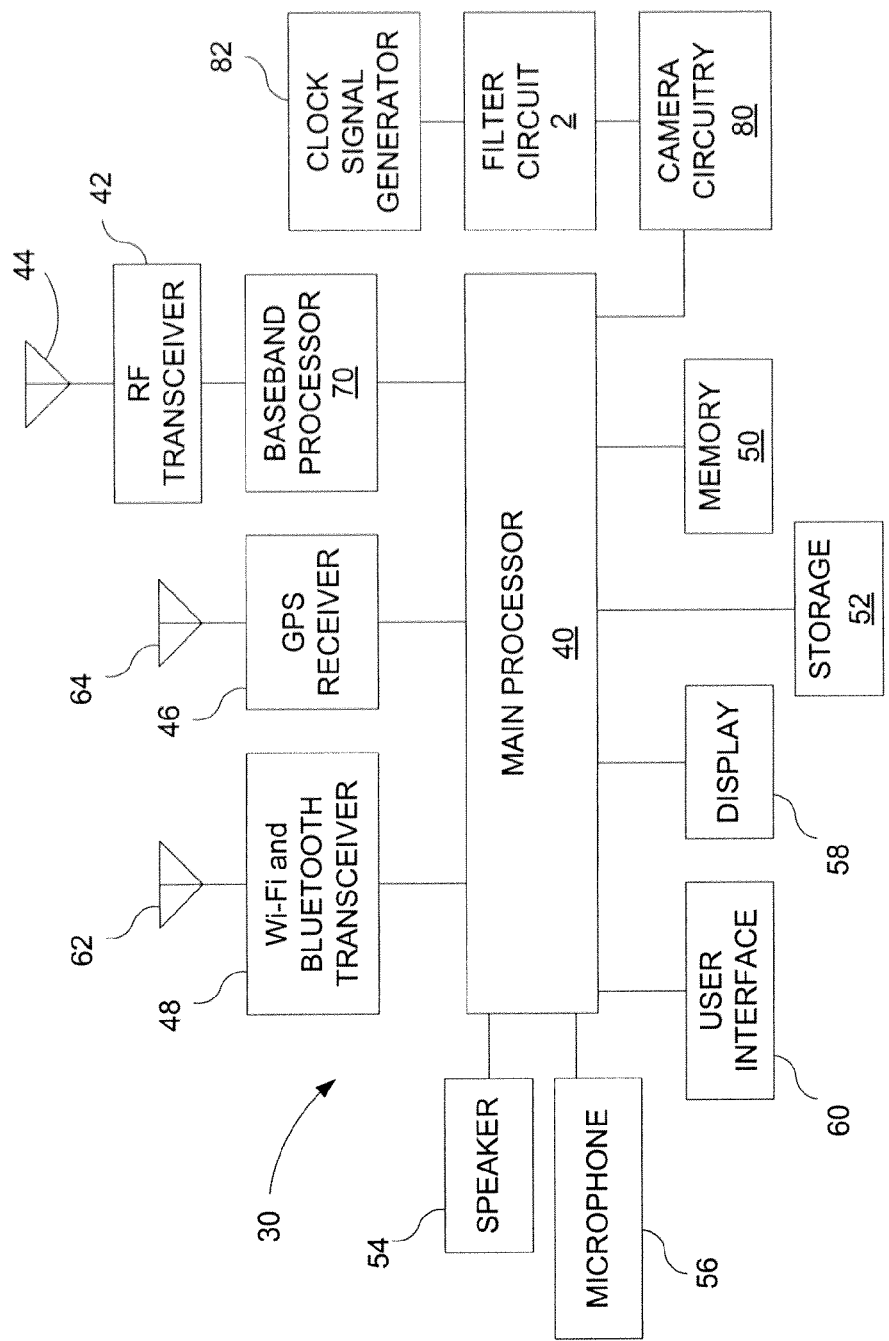
FIG. 5 is a block diagram of an example mobile device with a built-in camera.
Figure 6:
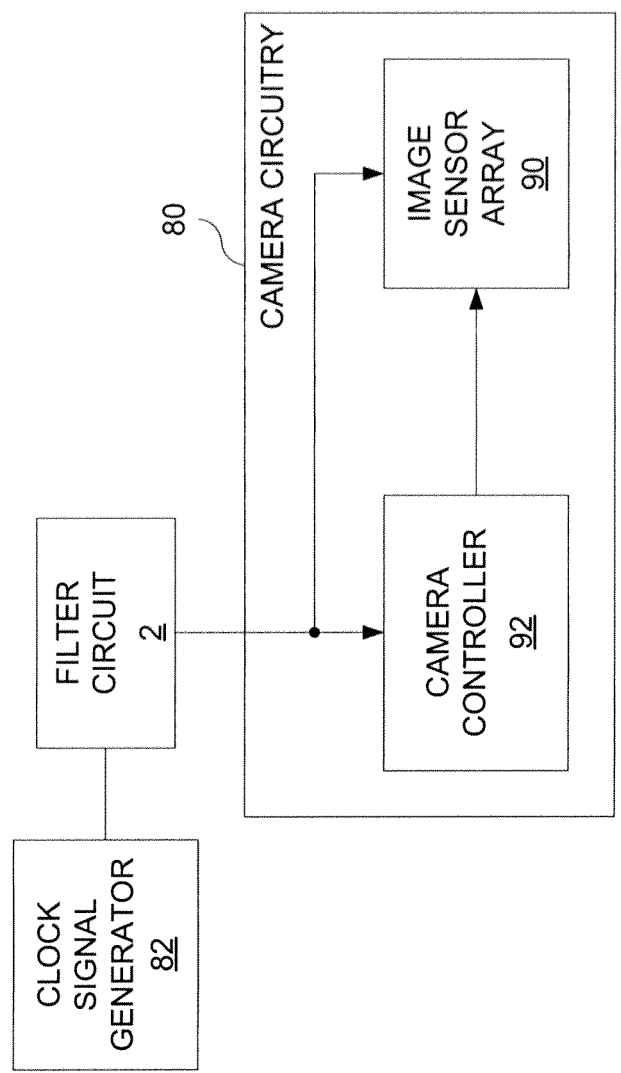
FIG. 6 is a block diagram of an example camera circuitry with a passive filter circuit.

FIG. 5 is an example block diagram of the camera-equipped mobile communications device 30. The mobile device 30 includes a main processor 40 that interacts with a GPS receiver 46, a Wi-Fi and Bluetooth transceiver 48, memory 50, storage 52, a speaker 54, a microphone 56, a display 58, and a user interface 60. The various components of the mobile device 30 may be digitally interconnected and used or managed by a software stack being executed by the main processor 40. Many of the components shown or described here may be implemented as one or more dedicated hardware units and/or a programmed processor (software being executed by a processor, e.g., the main processor 40).

The main processor 40 controls the overall operation of the mobile device 30 by performing some or all of the operations of one or more applications implemented on the mobile device 30, by executing instructions for it (software code and data) that may be found in the storage 52. The processor may, for example, drive the display 58 and receive user inputs through the user interface 60 (which may be integrated with the display 58 as part of a single, touch sensitive display panel 34 on the front face of the mobile device 30). The main processor 40 may also control the reception of forward channel signals and the transmission of reverse channel signals by an RF transceiver 42.

Storage 52 provides a relatively large amount of "permanent" data storage, using nonvolatile solid state memory (e.g., flash storage) and/or a kinetic nonvolatile storage device (e.g., rotating magnetic disk drive). Storage 52 may include both local storage and storage space on a remote server. Storage 52 may store data, such as image data taken with the mobile device 30, and software components that control and manage, at a higher level, the different functions of the mobile device 30. For instance, there may be telephony application that configures a built-in touch sensitive display to look like the keypad of a traditional telephony handset, and allows the user to enter a telephone number to be called, or select a previously stored number from a telephone address book. The telephony application then proceeds to allow the user to make a call, and controls the built-in microphone 56 and earpiece speaker 54 to enable the user to experience a two-way conversation during the call. Another application may be a camera application that would allow the user to take pictures and video through the user interface 60 and display 58.

In addition to storage 52, there may be memory 50, also referred to as main memory or program memory, which provides relatively fast access to stored code and data that is being executed by the main processor 40. Memory 50 may include solid state random access memory (RAM), e.g., static RAM or dynamic RAM. There may be one or more processors, e.g., main processor 40, that run or execute various software programs, modules, or sets of instructions (e.g., applications) that, while stored permanently in the storage 52, have been transferred to the memory 50 for execution, to perform the various functions described above. It should be noted that these modules or instructions need not be implemented as separate programs, but rather may be combined or otherwise rearranged in various combinations. In addition, the enablement of certain functions could be distributed amongst two or more modules, and perhaps in combination with certain hardware.

The mobile device 30 includes components that are required for wireless communications, such as the RF transceiver 42 and associated antenna 44. The device 30 may also include other wireless communications components, such as the Wi-Fi and Bluetooth transceiver 48 and its associated antenna 62, and the GPS receiver 46 and its associated antenna 64. Accordingly, there is the likelihood that one or more of these components will be adversely affected by harmonic components in a clock signal used by a digital camera in the device 30.

The RF transceiver 42 may communicate with a base station of a wireless communication network using a cellular band such as an 800 MHz band. Other RF or even microwave communication bands are possible. RF transceiver 42 receives, from antenna 44, an incoming RF signal transmitted by the base station. RF transceiver 42 may down-convert the incoming RF signal to produce a baseband signal. The baseband signal is sent to a baseband processor 70 that produces a processed baseband signal by filtering, decoding, and/or digitizing the baseband signal. The baseband processor 70 provides the processed baseband signal to the main processor 40. The main processor 40 may then transmit the processed baseband signal to the speaker 54 (e.g., voice communications) or perform further processing of the processed baseband signal for display to the user (e.g., data communications such as text messaging and web browsing). The baseband processor 70 may also receive voice data or other outgoing baseband data (e.g., web data, email, text message) from the main processor 40. The baseband processor 70 may encode, multiplex, and/or digitize the outgoing baseband data to produce a processed baseband signal. RF transceiver 42 receives the outgoing processed baseband signal and may up-convert the baseband signal to an RF signal that is transmitted via the antenna 44.

The mobile device 30 has a built-in camera that includes camera circuitry 80. The camera circuitry 80 implements the digital camera functionality, which is shown in detail in the block diagram of FIG. 6, of the device 30. The camera circuitry 80 may include a microelectronic image sensor array 90 and a camera controller 92. The camera controller 92 (e.g., implemented as a combination of programmed data processing components and hardwired logic circuitry) manages the process of capturing images. It does so by generating various commands that are signaled to the sensor array 90, which captures light from a scene. The sensor array 90 responds to the incident light and collects photo-generated charge or forms image signals during an integration interval (or exposure interval). At the end of the integration interval, the image signals are read (including being digitized) and transferred as a captured digital image or "exposure" to an image storage, which may be memory 50 or storage 52, that stores many digital images captured by the sensor array 90.

The operation of the camera circuitry 80, including the timing of image capture by the sensor array 90, is driven by a clock signal of a predetermined frequency, which is provided by a clock signal generator 82. The clock signal generator 82 may be a function that is integrated into the main processor 40, or it may be a separate circuit (e.g., a voltage controlled oscillator) that generates the clock signal. In one embodiment, the clock signal fundamental frequency is between 10 MHz and 100 MHz. Because the clock signal may radiate frequencies that can interfere with wireless communications components that are integrated in the device 30, the clock signal is filtered by a filter circuit 2 (shown in FIG. 1) prior to it being received by the camera circuitry 80. The filter circuit 2 attenuates an undesired frequency in the clock signal, such as between 800 MHz and 900 MHz, and more particularly at about 880 MHz that the device 30 uses for RF wireless communications. Of course, the filter circuit 2 may alternatively be designed to attenuate other RF bands (which may be at least several times higher in frequency than the clock signal fundamental). Because the sensor array 90 captures and transfers its image data at a high rate, the filter circuit 2 should attenuate the undesired frequency without significantly impacting the rise time of the clock signal. This may be achieved, as explained above, through the addition of the inductor L2 (to the "front" leg of the pi filter) having a selected inductance value that lowers a resonant frequency of the front leg to equal that of the undesired frequency (e.g., a fundamental frequency of an RF wireless communications radiated carrier signal.)

To conclude, various aspects of a passive filter circuit for attenuating an undesired frequency in a clock signal is described. For purposes of explanation, specific embodiments were described to provide a thorough understanding of the present invention. These should not be construed as limiting the scope of the invention but merely as illustrating different examples and aspects of the invention. It should be appreciated that the scope of the invention includes other embodiments not discussed in detail above. Various other modifications, changes, and variations which will be apparent to those skilled in the art may be made in the arrangement, operation, and details of the systems and methods of the present invention disclosed herein without departing from the spirit and scope of the invention as defined in the appended claims. For instance, while the device 30 is depicted in FIG. 1 as a mobile telephony device with wireless call capability and a built-in camera (e.g., a smart phone handset), it may alternatively be a digital still or video camera (e.g., a handheld camcorder) with wireless networking capability. Therefore, the scope of the invention should be determined by the claims and their legal equivalents. Such equivalents include both currently known equivalents as well as equivalents developed in the future, i.e., any elements developed that perform the same function, regardless of structure. Furthermore, no element, component, or method step is intended to be dedicated to the public regardless of whether the element, component, or method step is explicitly recited in the claims.

What is claimed is:

1. A circuit comprising:
   a digital signal generator to produce a digital signal; and
   a passive filter circuit for filtering the digital signal to attenuate at a radio communications frequency, the passive filter circuit comprising
   a first stage to receive the digital signal, the first stage having a first inductor and a first branch coupled to the output of the first inductor, the first branch having a first capacitor and a second inductor, and
   a second stage coupled to the first stage, the second stage having a third inductor and a second branch coupled to the output of the third inductor, the second branch having a second capacitor.

2. The circuit of claim 1, wherein the radio communications frequency is between 800 MHz and 900 MHz.

3. The circuit of claim 1, wherein a capacitance value of the first capacitor substantially equals a capacitance value of the second capacitor.

4. The circuit of claim 1, wherein the first capacitor and the second inductor are discrete components, wherein addition of the second inductor to the first branch lowers a resonant frequency of the first branch without having to increase a capacitance value of the first capacitor, which degrades a rise time of an output signal.

5. The circuit of claim 4, wherein the rise time of the output signal does not exceed 12 nanoseconds.

6. The circuit of claim 1, wherein the inductance value of the second inductor is smaller than that of the first inductor and the third inductor.

7. The circuit of claim 1, wherein the second branch provides a rolled-off frequency response at frequencies above the undesired frequency.

8. A circuit comprising:
   a digital signal generator to produce a digital signal; and
   a passive filter circuit for filtering the digital signal to attenuate at a radio communications frequency, the passive filter circuit comprising
   an input terminal to receive the digital signal,
   an output terminal to provide a filtered version of the digital signal, and
   a first inductor, a second inductor, and a third inductor, the first inductor and the third inductor coupled in series between the input terminal and the output terminal; and
   a first capacitor and a second capacitor, the first capacitor and the second inductor coupled in series between (1) a node that is between the first inductor and the third inductor and (2) ground, wherein the second capacitor is coupled between the output terminal and ground.

9. The circuit of claim 8, wherein the inductance and capacitance values of the first inductor, the first capacitor, and the second inductor are selected to attenuate the radio communications frequency.

10. The circuit of claim 9, wherein the radio communications frequency is between 800 MHz and 900 MHz and the digital signal's fundamental frequency is less than 100 MHz.

11. The circuit of claim 8, wherein a capacitance value of the first capacitor substantially equals a capacitance value of the second capacitor.

12. The circuit of claim 8, wherein the inductance value of the second inductor is smaller than that of the first inductor and the third inductor.

13. The circuit of claim 8, wherein the second inductor lowers a resonant frequency of the passive filter circuit without having to increase a capacitance value of the first capacitor, which degrades arise time of the filtered version of the digital signal.

14. The circuit of claim 13, wherein the rise time of the filtered version of the digital signal does not exceed 12 nanoseconds.

15. The circuit of claim 8, wherein the second capacitor connected between the output terminal and ground provides a rolled-off frequency response at frequencies above the radio communications frequency.

16. A mobile communications device, comprising:
   an antenna coupled to radio communications circuitry to establish a wireless connection through a wireless communications network;
   camera circuitry to capture an image of a scene;
   a clock signal generator to produce a clock signal for operation of the camera circuitry; and
   a passive filter circuit having an input coupled to the clock signal generator, an output coupled to the camera circuitry, a first inductor at the input, a pi filter coupled to the first inductor, the pi filter having a first leg with a first capacitor and a second leg with a second capacitor, and a second inductor coupled in series with the first capacitor in the first leg of the pi filter.

17. The mobile communications device of claim 16, wherein a capacitance value of the first capacitor substantially equals a capacitance value of the second capacitor.

18. The mobile communications device of claim 16, wherein the inductance value of the second inductor is smaller than that of the first inductor and a third inductor.

19. The mobile communications device of claim 16, wherein the passive filter circuit is designed to attenuate an undesired frequency between 800 MHz and 900 MHz.

20. The mobile communications device of claim 19, wherein the second leg provides a rolled-off frequency response at frequencies above the undesired frequency.

21. The mobile communications device of claim 16, wherein the second inductor lowers the resonant frequency of the first leg without having to increase a capacitance value of the first capacitor, which degrades a rise time of an output signal of the passive filter circuit.

22. The mobile communications device of claim 21, wherein the rise time of the output signal does not exceed 12 nanoseconds.

* * * * *